United States Patent
Sunohara et al.

(10) Patent No.: US 7,420,128 B2
(45) Date of Patent: Sep. 2, 2008

(54) ELECTRONIC COMPONENT EMBEDDED SUBSTRATE AND METHOD FOR MANUFACTURING THE SAME

(75) Inventors: Masahiro Sunohara, Nagano (JP); Mitsutoshi Higashi, Nagano (JP); Kei Murayama, Nagano (JP); Hiroyuki Kato, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 170 days.

(21) Appl. No.: 11/190,651

(22) Filed: Jul. 27, 2005

(65) Prior Publication Data
US 2006/0021791 A1 Feb. 2, 2006

(30) Foreign Application Priority Data
Aug. 2, 2004 (JP) ............................. 2004-225543

(51) Int. Cl.
*H05K 1/16* (2006.01)
(52) U.S. Cl. ........................ 174/260; 361/761; 29/841
(58) Field of Classification Search ................. 174/260; 361/761–764; 29/830, 832, 841
See application file for complete search history.

(56) References Cited

U.S. PATENT DOCUMENTS

| 3,903,590 | A | * | 9/1975 | Yokogawa | 438/107 |
| 6,268,616 | B1 | * | 7/2001 | Kamekawa | 257/48 |
| 6,750,397 | B2 | * | 6/2004 | Ou et al. | 174/524 |
| 6,955,948 | B2 | * | 10/2005 | Asahi et al. | 438/125 |
| 7,091,593 | B2 | * | 8/2006 | Ishimaru et al. | 257/686 |
| 7,141,884 | B2 | * | 11/2006 | Kojima et al. | 257/778 |
| 7,165,321 | B2 | * | 1/2007 | Kondo et al. | 29/832 |
| 2003/0116843 | A1 | | 6/2003 | Iijima et al. | |
| 2004/0001324 | A1 | * | 1/2004 | Ho et al. | 361/761 |

* cited by examiner

*Primary Examiner*—Jeremy C Norris
(74) *Attorney, Agent, or Firm*—Ladas & Parry LLP

(57) ABSTRACT

An electronic component embedded substrate and a method for manufacturing the substrate are disclosed. The electronic component embedded substrate includes a substrate main body and an electronic component embedded in the substrate main body. The center plane of the electronic component in the thickness direction thereof and the center plane of the substrate main body in the thickness direction thereof generally match each other.

8 Claims, 23 Drawing Sheets

ELECTRONIC COMPONENT EMBEDDED SUBSTRATE AND METHOD FOR MANUFACTURING THE SAME

BACKGROUND OF THE INVENTION

1. Field of the Invention

The present invention relates to an electronic component embedded substrate and a method for manufacturing the same, and particularly relates to an electronic component embedded substrate wherein an electronic component is embedded in a substrate main body and a method for manufacturing the same.

2. Description of the Related Art

In these years, as semiconductor elements with higher operating frequency have been mounted on semiconductor devices, stabilization of the power supply voltage to the semiconductor elements is becoming necessary. To meet such a need, an electronic component embedded substrate is proposed wherein an electronic component (e.g. capacitor element) is embedded in a semiconductor substrate on which a semiconductor element is mounded.

In the meantime, with the increase of mounting density of semiconductor elements, the pitch of electrode pads formed on the semiconductor elements is being made smaller. However, it is difficult to form wiring patterns on conventional common printed wiring boards with the pitch as small as the pitch of the electrode pads formed on the semiconductor elements. Therefore, the common printed wiring boards are becoming unusable as substrates for mounting semiconductor elements.

Due to such circumstances, the use of multilayer wiring boards called built-up printed wiring boards is increasing. In a multilayer wiring board, a printed wiring board is used as a core layer, and built-up layers and wiring layers are laminated on both faces of the printed wiring board. The wiring layers are interconnected through vias. The term "built-up layer" used herein indicates a layer (a single layer) which is formed with a built-up method, and on the surface of which a wiring layer is formed.

As disclosed in, for example, Patent Document 1, in order to embed an electronic component such as a capacitor element into a multilayer wiring board of this type, the electronic component is incorporated into one of multiple built-up layers.

FIG. 1 is a cross-sectional view illustrating an example of a related-art electronic component embedded substrate 1. The electronic component embedded substrate 1 comprises a core substrate 2, an electronic component 5, and built-up layers 6. The core substrate 2 is, for example, a resin substrate, having wires 3 on upper and lower faces thereof.

The electronic component 5 is, for example, a capacitor element or a semiconductor element, which is bonded to one of the faces (the upper face in the example shown in FIG. 1) of the core substrate 2 with an adhesive agent 4. The built-up layers 6 are formed on the upper and lower faces of the core substrate 2, so the electronic component 5 is incorporated in the built-up layer 6 formed on the upper face of the core substrate 2.

The upper built-up layer 6 is provided with electrode vias 8, through vias 9, and wires 10. The electrode vias 8 are configured to electrically connect the wires 3 formed on the upper face of the core substrate 2 to the wires 10 formed on an upper face of the upper built-up layer 6. The through vias 9 are configured to electrically connect electrodes 7 formed on the electronic component 5 to the wires 10.

Solder resists 11 are formed on surfaces of the built-up layers 6 formed on both faces of the core substrate 2. Openings are formed at predetermined positions of the solder resists 11 such that the wires 10 can have external connections.

[Patent Document 1] Japanese Patent Laid-Open Publication No. 2003-197809, also published as U.S. Patent Application Publication No. 2003/0116843

In such a electronic component embedded substrate 1 in which the core substrate 2 is provided, the electronic component 5 is fixed to either one of the upper face and the lower face of the core substrate 2 and incorporated in one of the built-up layers 6 formed on the same side. With this configuration, however, a center plane of the electronic component 5 does not coincide with the center plane of the electronic component embedded substrate 1.

More specifically, there is a distance (indicate by an arrow H) between the center plane CE1 of the electronic component embedded substrate 1 in a thickness direction (indicated by arrows Z1 and Z2 in FIG. 1) and the center plane CE2 of the electronic component 5 in the thickness direction.

The electronic component 5 is made of a material, such as ceramic and silicon, different from the material (resin) of the core substrate 2 and the built-up layers 6. That is, the electronic component 5 has a thermal expansion coefficient different from the core substrate 2 and the built-up layers 6. Therefore, when the electronic component 5 is embedded in the core substrate 2 with a distance between the center plane CE1 of the electronic component embedded substrate 1 and the center plane CE2 of the electronic component 5, an imbalanced thermal expansion within the electronic component embedded substrate 1 causes warpage in the electronic component embedded substrate 1. For example, experience shows that if the substrate size of the electronic component embedded substrate 1 is 7×10 mm, a warpage of 120 μm occurs. This size of warpage is large enough to make it difficult to have the electronic component embedded substrate 1 in practical use.

SUMMARY OF THE INVENTION

A general object of the present is to provide an electronic component embedded substrate and a method for manufacturing the same to solve at least one problem described above.

A specific object of the present invention is to provide an electronic component embedded substrate that prevents warpage due to thermal expansion by balancing the thermal expansion within the substrate and a method for manufacturing the same.

To achieve these and other objects, the present invention provides an electronic component embedded substrate comprising a substrate main body, and an electronic component embedded in the substrate main body, wherein a center plane of the electronic component in a thickness direction thereof and the center plane of the substrate main body in a thickness direction thereof generally match each other.

As the center plane of the electronic component in the thickness direction thereof and the center plane of the substrate main body in the thickness direction thereof generally match each other, a vertical thermal expansion of the electronic component embedded substrate with respect to a center plane of the substrate in the thickness direction thereof is balanced even. Therefore, the substrate is prevented from being warped due to an imbalanced thermal expansion.

In the above-described electronic component embedded substrate, it is preferable that wires formed on the substrate main body be interconnected through a first via, and one of the wires and the electronic component be interconnected through a second via.

In this fashion, as the electrical connections within the electronic component embedded substrate are made through vias, the vias and wiring can be formed at the same time. Therefore, the production process is simplified.

In the above-described electronic component embedded substrate, it is also preferable that the wires formed on the substrate main body be interconnected through a first stud bump, and one of the wires and the electronic component be interconnected through a second stud bump.

Because the stud bumps can be easily formed, it is possible to produce the electronic component embedded substrate at a reduced cost.

In the above-described electronic component embedded substrate, it is also preferable that the substrate main body be configured to surround the electronic component only on lateral faces of the electronic component.

With this configuration, because the substrate main body is not present on an upper face nor a lower face of the electronic component, the thickness of the electronic component embedded substrate is reduced.

The present invention also provides a method for manufacturing an electronic component embedded substrate, comprising the steps of: arranging an electronic component on a first insulating layer; laminating a second insulating layer on the first insulating layer with the electronic component arranged thereon, thereby forming a substrate main body in which the electronic component is embedded such that a center plane of the laminated first and second insulating layers in a thickness direction thereof and the center plane of the electronic component in the thickness direction thereof match each other; forming a through via hole extending through the substrate main body and an electrode via hole communicating with an electrode of the electronic component in the substrate main body; and forming a via in each of the through via hole and the electrode via hole while forming a wire on the substrate main body.

The present invention also provides a method for manufacturing an electronic component embedded substrate, comprising the steps of; forming a first wire on a support plate; forming a first stud bump on the first wire; forming a first insulating layer on the support plate such that only a tip end of the first stud bump is exposed; arranging an electronic component on the first insulating layer; building up a second stud bump on the first stud bump so as to be substantially level with an electrode of the electronic component; laminating a second insulating layer having substantially the same thickness as the first insulating layer on the first insulating layer such that the electronic component and the second stud bump are covered by the second insulating layer but only the electrode of the electronic component and a tip end of the second stud bump are exposed, thereby forming a substrate main body in which the electronic component is embedded such that a center plane of the laminated first and second insulating layers in a thickness direction thereof and the center plane of the electronic component in the thickness direction thereof match each other; and forming a second wire that connects the electrode of the electronic component to the second stud bump.

According to the above-described methods, an electronic component embedded substrate wherein a center plane of the substrate main body formed by the laminated first and second insulating layers in a thickness direction thereof and the center plane of the electronic component in the thickness direction thereof match each other can be easily produced.

DETAILED DESCRIPTION OF THE PREFERRED EMBODIMENT

The following provides exemplary embodiments of the present invention with reference to the accompanying drawings.

Figure 1:
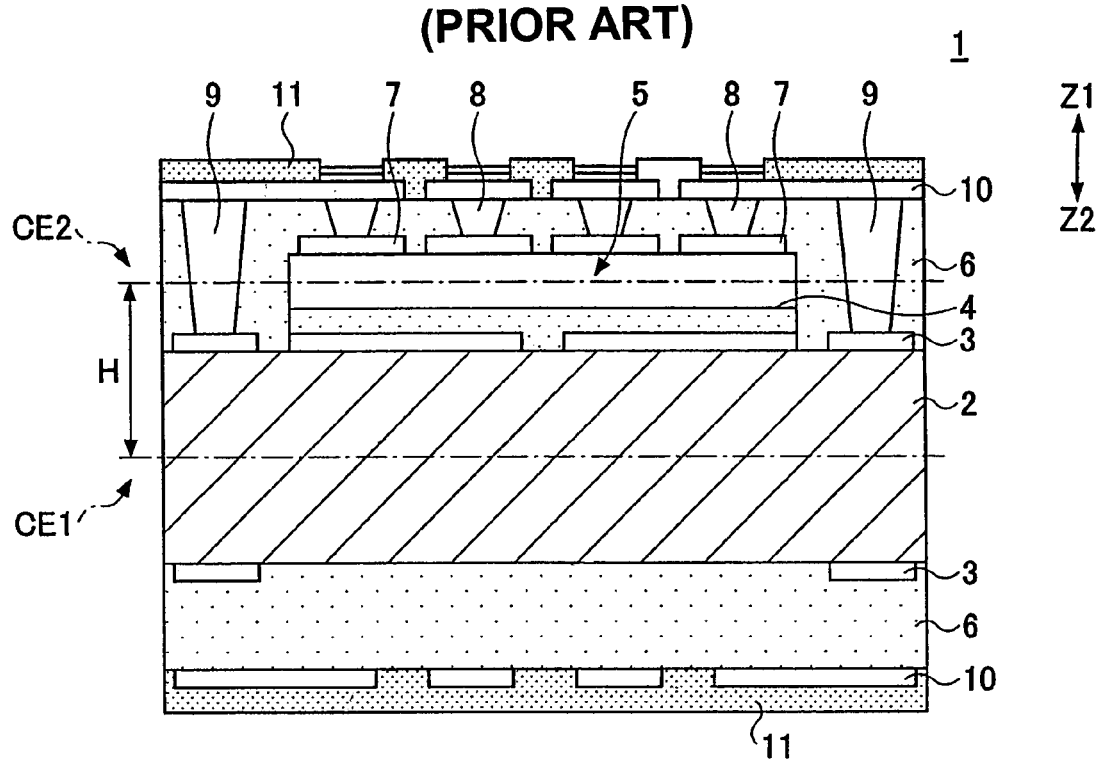
FIG. 1 is a cross-sectional view illustrating an example of a related-art electronic component embedded substrate.
Figure 2:
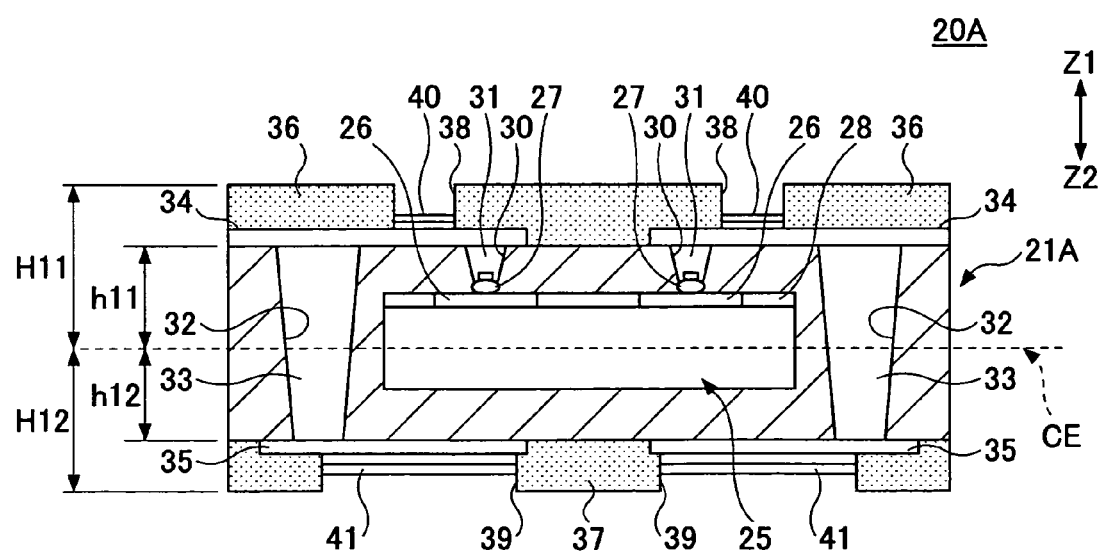
FIG. 2 is a cross-sectional view illustrating an electronic component embedded substrate according to a first embodiment of the present invention.

FIG. 2 is a cross-sectional view illustrating an electronic component embedded substrate 20A according to a first embodiment of the present invention. The electronic component embedded substrate 20A has a very simple structure, comprising a substrate main body 21A and an electronic component 25.

The substrate main body 21A has a laminated structure including first and second built-up layers 22 and 23 (as described below in detail), in which the electronic component 25 is embedded. The first and second built-up layers 22 and 23 are made of, for example, insulating epoxy resin.

In this embodiment, upper wires 34 and lower wires 35 are formed on an upper face and a lower face of the substrate main body 21A, respectively. With through vias 33 formed in through via holes 32 extending through the substrate main body 21, the upper wires 34 and the lower wires 35 are electrically connected to each other.

The electronic component 25 is, for example, a capacitor element or a semiconductor element. The electronic component 25 is made of a material (e.g. ceramic and silicon) having a thermal expansion coefficient different from the substrate main body 21A (built-up layers 22 and 23). Electrodes 26 are formed on a circuit face (upper face in FIG. 2) of the electronic component 25. In this embodiment, electrode stud bumps 27 are formed on the electrodes 26. The circuit face of the electronic component 25 is covered with and protected by a passivation film 28 except where the electrodes 26 are formed.

The electrode stud bumps 27 formed on the electronic component 25 are connected to the upper wires 34 through electrode vias 31 disposed in the electrode via holes 30 formed in the substrate main body 21A.

An upper solder resist 36 is formed on the upper face of the substrate main body 21A to protect the upper wires 34. Likewise, a lower solder resist 37 is formed on the lower face of the substrate main body 21A to protect the lower wires 35. Outer chip mount pads 40 are formed in openings 38 formed at predetermined positions in the upper solder resist 36. On the other hand, board mount terminals 41 are formed in openings 39 formed at predetermined positions in the lower solder resist 37.

The outer chip mount pads 40 are a part of the upper wires 34 exposed from the upper solder resist 36 by forming the openings 38. An outer chip (semiconductor element, etc.) not shown is mounted on the outer chip mount pads 40. The board mount terminals 41 are a part of the lower wires 35 exposed from the lower solder resist 37 by forming the openings 38. External connection terminals (solder balls, etc.) not shown are mounted on board mount terminals 41.

The following discussion focuses on a center plane of the electronic component 25 in a thickness direction (direction of arrows Z1 and Z2 in FIG. 2) and the center plane of the substrate main body 21A in the thickness direction (direction of the arrows Z1 and Z2 in FIG. 2) in the electronic component embedded substrate 20A according to this embodiment.

In this embodiment, the center plane of the electronic component 25 in the thickness direction (direction of arrows Z1 and Z2 in FIG. 2) and the center plane of the substrate main body 21A in the thickness direction (direction of arrows Z1 and Z2 in FIG. 2) are positioned to match each other, or are positioned on the same plane (indicated by an arrow CE in FIG. 2). Accordingly, a thickness h11 from the center plane CE to the upper face of the substrate main body 21A is equal to the thickness h12 from the center plane CE to the lower face of the substrate main body 21A (h11=h12).

Also, the center plane of the electronic component 25 in the thickness direction and the center plane of the electronic component embedded substrate 20A including the solder resists 36 and 37 in the thickness direction (direction of the arrows Z1 and Z2 in FIG. 2) are positioned to match each other. Accordingly, a thickness H11 from the center plane CE to the upper face of the electronic component embedded substrate 20A is equal to the thickness H12 from the center plane CE to the lower face of the electronic component embedded substrate 20A (H11=H12).

With the configuration described above, thermal expansion of the electronic component embedded substrate 20A in the thickness direction with respect to the center plane CE is balanced, and therefore the electronic component embedded substrate 20A is prevented from being warped due to thermal expansion.

The following describes a method for manufacturing the above-described electronic component embedded substrate 20A with reference to FIGS. 3A-16. In FIGS. 3A-16, elements identical to those in FIG. 2 bear the same reference numbers and are not further described. FIGS. 3A, 4A, 5A, 6A, 7A, 8A and 9A are cross-sectional views, while FIGS. 3B, 4B, 5B, 6B, 7B, 8B and 9B are plan views.

Figure 3A:
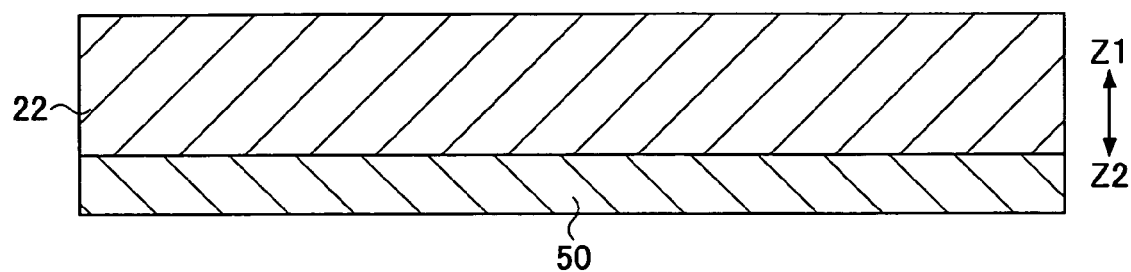
FIGS. 3A-16 are schematic diagrams illustrating a method for manufacturing the electronic component embedded substrate according to the first embodiment of the present invention.
Figure 3B:
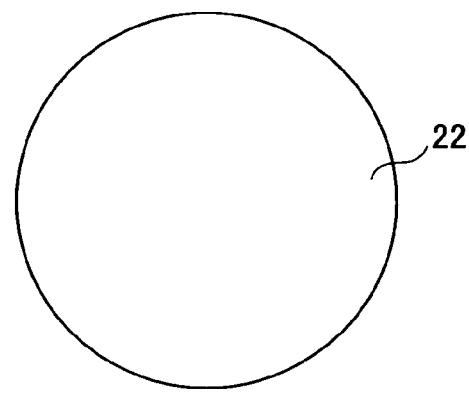

For manufacturing the electronic component embedded substrate 20A, the first built-up layer 22 shown in FIGS. 3A and 3B is prepared. The first built-up layer 22 is made of, for example, insulating epoxy resin, and is not cured yet. The thickness of the first built-up layer 22 is, for example, 70 μm.

The first built-up layer 22 is supported by a support body 50 disposed on the lower face of the first built-up layer 22. The support body 50 is made of, for example, PET (polyethylene terephthalate), PI (polyimide), or PEN (polyethylene naphthalate). The thickness of the support body 50 is about 100 μm.

Although plural electronic component embedded substrates 20A are produced at once from the first built-up layer 22 in actual production of the electronic component embedded substrate 20A, FIGS. 3A-16 illustrate only an area where one electronic component embedded substrate 20A is produced for the purpose of simplifying the description.

The electronic component 25 is embedded in the first built-up layer 22. There are various methods for embedding the electronic component 25 into the first built-up layer 22 (see FIGS. 43A-45E), which are described below.

Figure 4A:
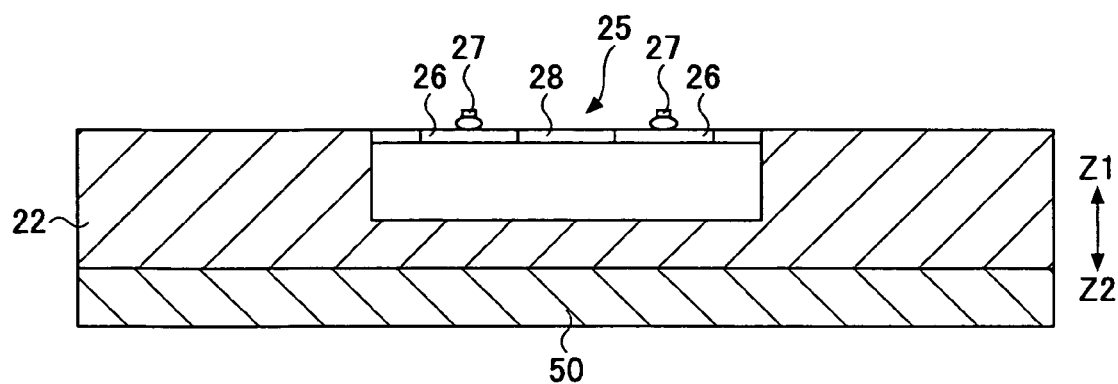
Figure 4B:
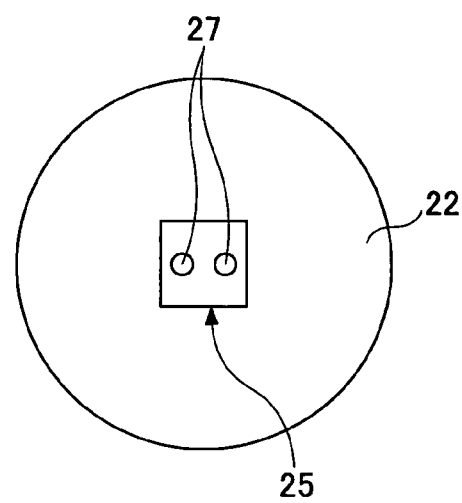

FIGS. 4A and 4B show the electronic component 25 embedded in the first built-up layer 22. The thickness of the electronic component 25 is, for example, 50 μm. The electrode stud bumps 27 are formed on the electronic component 25 in advance.

The electrode stud bumps 27 are gold bumps, which are formed with wire bonding techniques, and arranged on the electrodes 26. In this embodiment, the electronic component 25 is embedded in the first built-up layer 22 such that an upper face of the passivation film 28 covering the circuit face of the electronic component 25 is flush with the upper face of the first built-up layer 22.

Figure 5A:
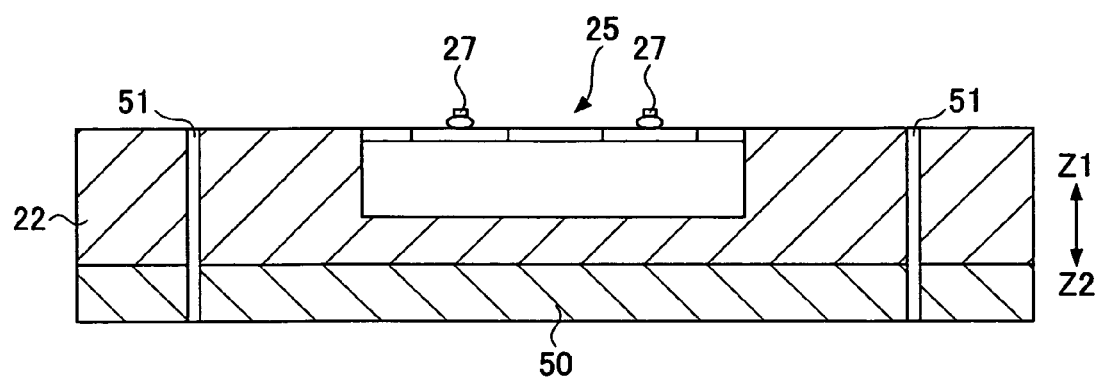
Figure 5B:
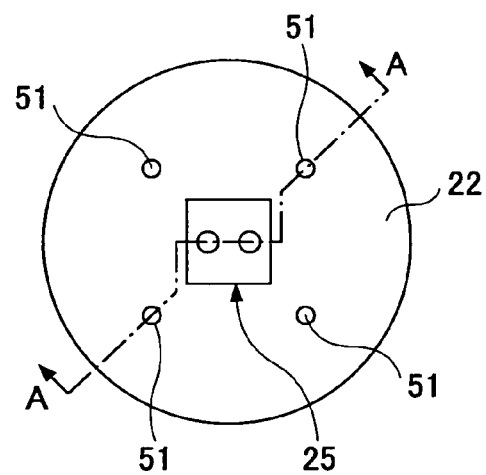

Then, reference holes 51 are formed in the first built-up layer 22. The reference holes 51 are formed with reference to the positions of the electrode stud bumps 27. Various machining methods such as laser machining, drilling, and punching are applicable for forming the reference holes 51. FIGS. 5A and 5B show the reference holes 51 formed in the first built-up layer 22.

Figure 6A:
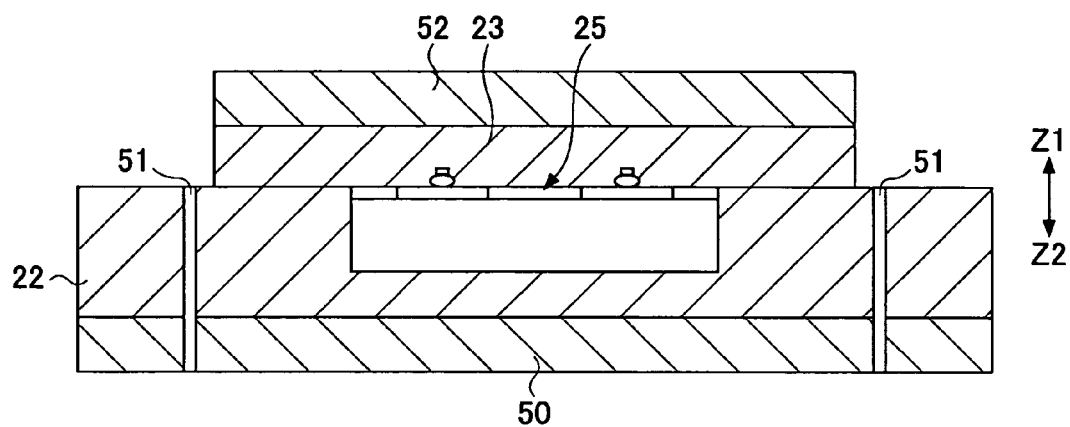
Figure 6B:
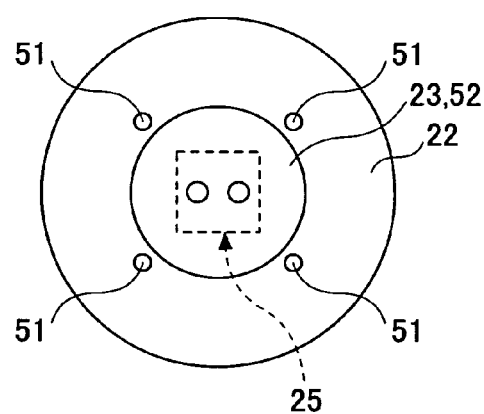

Referring to FIGS. 6A and 6B, the second built-up layer 23 is laminated on the first built-up layer 22 in which the reference holes 51 are formed. The second built-up layer 23 has a size that completely covers the electronic component 25 but does not extend over the reference holes 51. The second built-up layer 23 is also made of, for example, insulating epoxy resin, and is not cured yet. A passivation sheet 52 (e.g. PET film) for protecting the second built-up layer 23 is formed on an upper face of the second built-up layer 23.

Figure 7A:
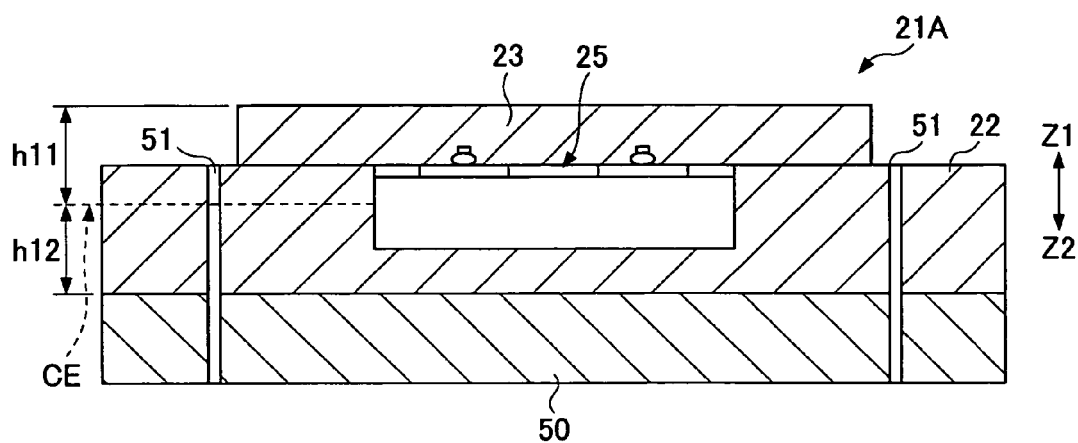
Figure 7B:
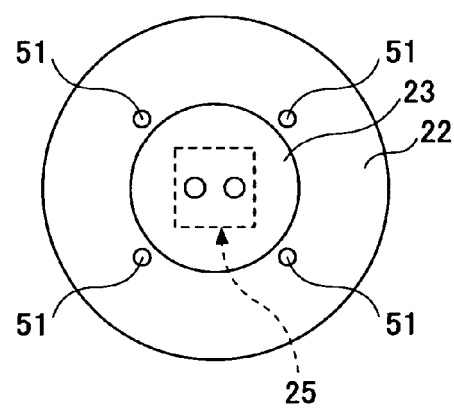

After the second built-up layer 23 is laminated on an upper side of the first built-up layer 22 as described above, the passivation sheet 52 is removed. The first and second built-up layers 22 and 23 are completely cured by heating at the same time. In this way, the substrate main body 21A shown in FIGS. 7A and 7B is formed.

The center plane CE of the electronic component 25 in the thickness direction and the center plane of the substrate main body 21A in the thickness direction are positioned to match each other. Accordingly, the thickness h11 from the center plane CE to the second built-up layer 23 is equal to the thickness h12 from the center plane CE to the lower face of the first built-up layer 22 (h11=h12).

When the substrate main body 21A is formed by the first built-up layer 22 and the second built-up layers 23 integrated by the curing, the electrode via holes 30 and the through via holes 32 are formed in the substrate main body 21A. In this embodiment, the via holes 30 and 32 are formed with a laser machining method (UV-YAG laser machine, wavelength of 355 nm). With this laser machining method, the via holes 30 and 32 can be formed with high accuracy at low cost.

Figure 8A:
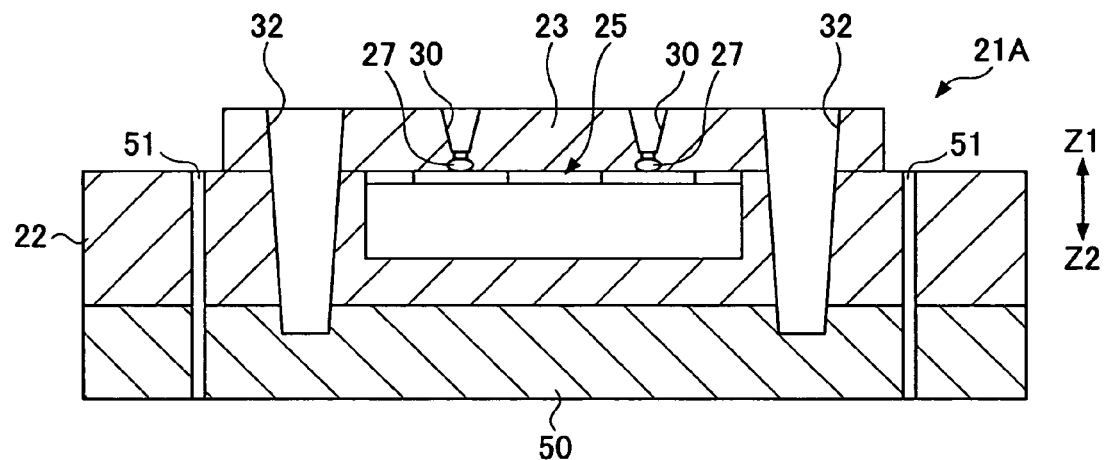
Figure 8B:
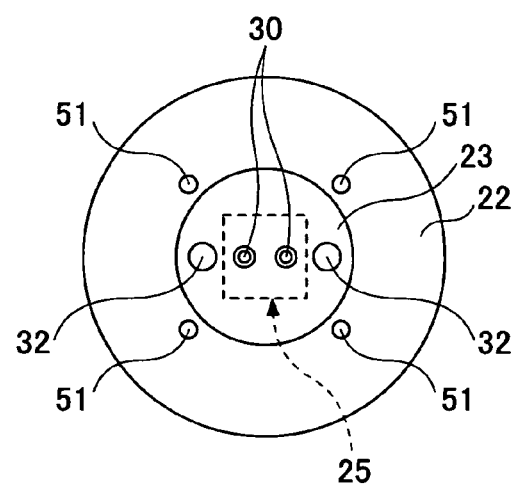

FIGS. 8A and 8B illustrate the electrode via holes 30 and the through via holes 32 formed in the substrate main body 21A. While forming the through via holes 32 in the substrate main body 21A, the support body 50 serves as a stopper of the laser machining.

Figure 9A:
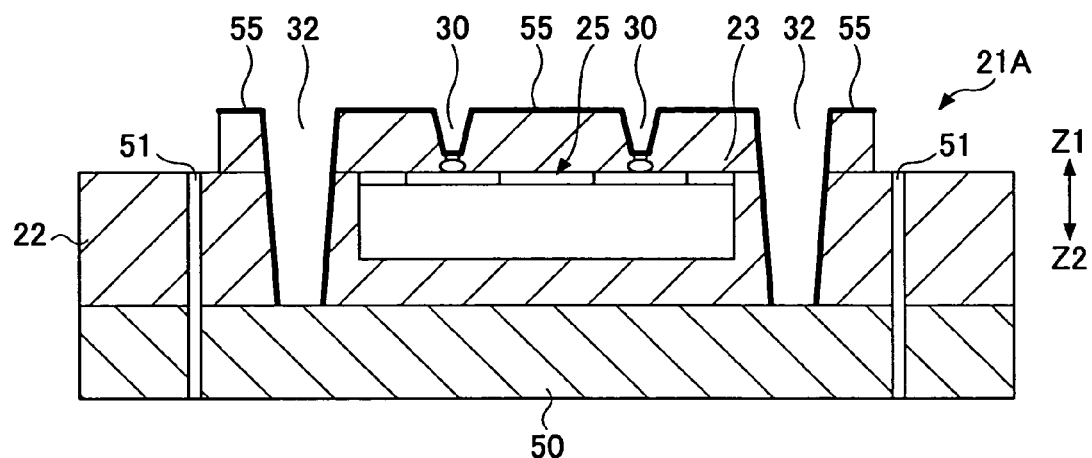
Figure 9B:
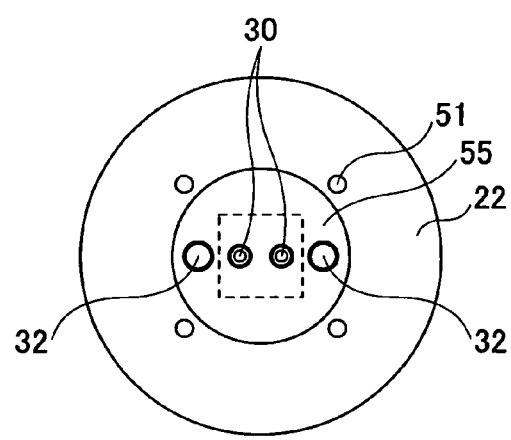

Then, the substrate main body 21A with the via holes 30 and 32 formed therein goes through an electroless copper plating process. In this process, a copper film 55 shown in FIGS. 9A and 9B is formed on a surface of the substrate main body 21A and inner surfaces of the via holes 30 and 32.

After the copper film 55 is formed, the support body 50 is removed. Then, a dry film resist (hereinafter referred to as DFR) 56 is formed on the upper face of the substrate main body 21A, and a DFR 57 is formed on the lower face of the substrate main body 21A. The DFRs 56 and 57 are laminated by a vacuum laminator.

Figure 10:
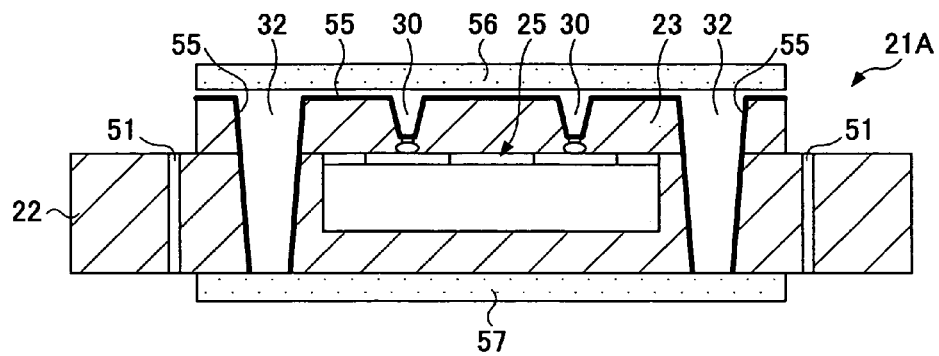

FIG. 10 illustrates the DFRs 56 and 57 formed on the substrate main body 21A. As shown in FIG. 10, the DFRs 56 and 57 are arranged not to cover the reference holes 51.

Figure 11:
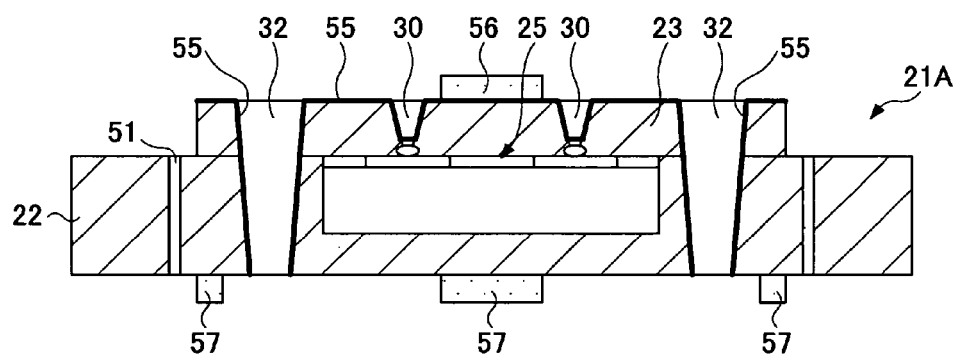
Figure 12:
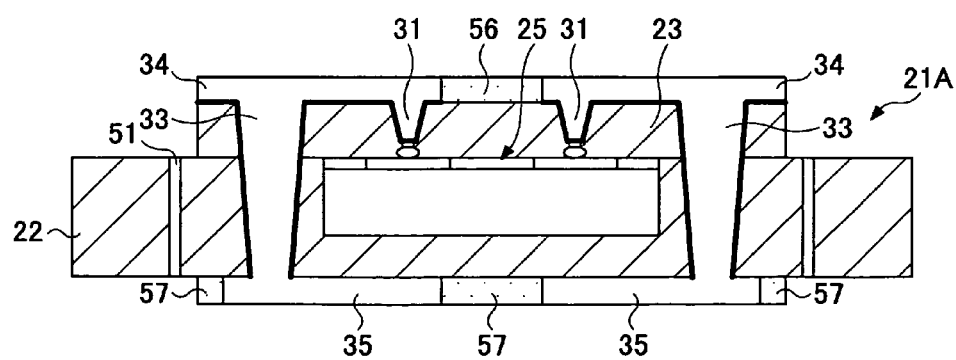

Then, referring to FIG. 11, the DFRs 56 and 57 are patterned into predetermined shapes by exposure and development. More specifically, portions of the DFRs 56 and 57 where the upper and lower wires 34 and 35 are to be formed are removed. The exposure to the DFRs 56 and 57 is performed with reference to the reference holes 51 formed in the substrate main body 21A. Therefore, the DFRs 56 and 57 are patterned with high accuracy.

Subsequently, electrolytic copper plating is performed using the copper film 55 as a seed layer. This process forms the upper wires 34 on the upper face of the substrate main body 21A, the lower wires 35 on the lower face of the substrate main body 21A, the electrode vias 31 in the electrode via holes 30, and the through vias 33 in the through via holes 32 (see FIG. 12).

As a result, the upper wires 34 are electrically connected to the electronic component 25 through the electrode vias 31. The upper wires 34 are also connected to the lower wires 35 through the through vias 33. In this embodiment, the electric connections within the electronic component embedded substrate 20A are made through the vias 31 and 33 as described above. As the vias 31 and 33 and the wires 34 and 35 are formed at the same time, the manufacturing process can be simplified.

Figure 13:
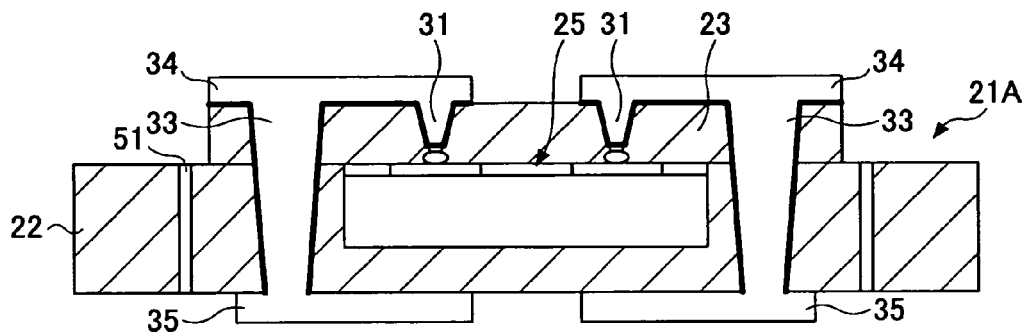
Figure 14:
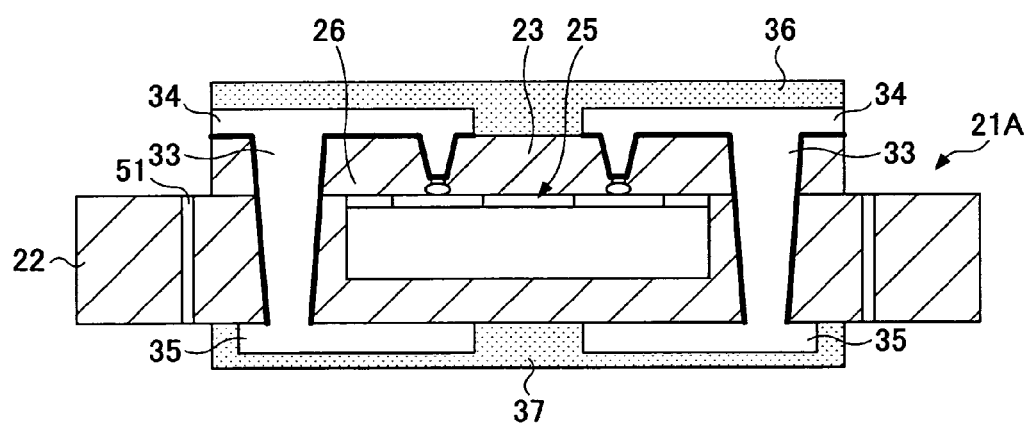

After the electrolytic copper plating is completed, the DFRs 56 and 57 are removed. The exposed part of the copper film 55 provided as a seed layer is also removed. FIG. 13 illustrates the substrate main body 21A with the DFRs 56 and 57 and the copper film 55 removed.

Then, an upper solder resist 36 is formed on the upper face of the substrate main body 21A, and a lower solder resist 37 is formed on the lower face of the substrate main body 21A. A vacuum laminator is used for laminating the solder resists 36 and 37. The solder resists 36 and 37 are arranged not to cover the reference holes 51 formed in the substrate main body 21A.

Figure 15:
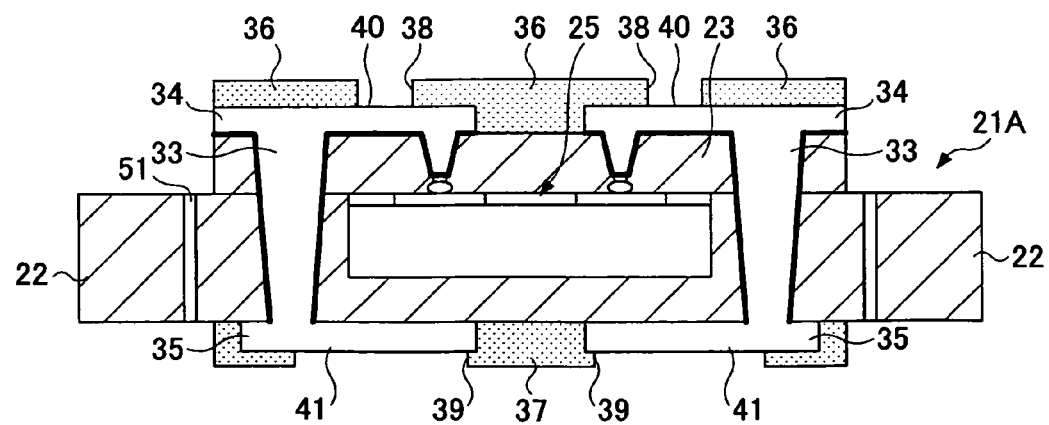

After that, with reference to FIG. 15, the solder resists 36 and 37 are patterned into predetermined shapes by exposure and development. More specifically, the openings 38 are formed in the upper solder resist 36, so that the outer chip mount pads 40 are formed.

On the other hand, the openings 39 are formed in the lower solder resist 37, so that the board mount terminals 41 are formed. The exposure to the solder resists 36 and 37 is performed with reference to the reference holes 51 formed in the substrate main body 21A. Therefore, the outer chip mount pads 40 and the board mount terminals 41 can be formed with high accuracy.

Figure 16:
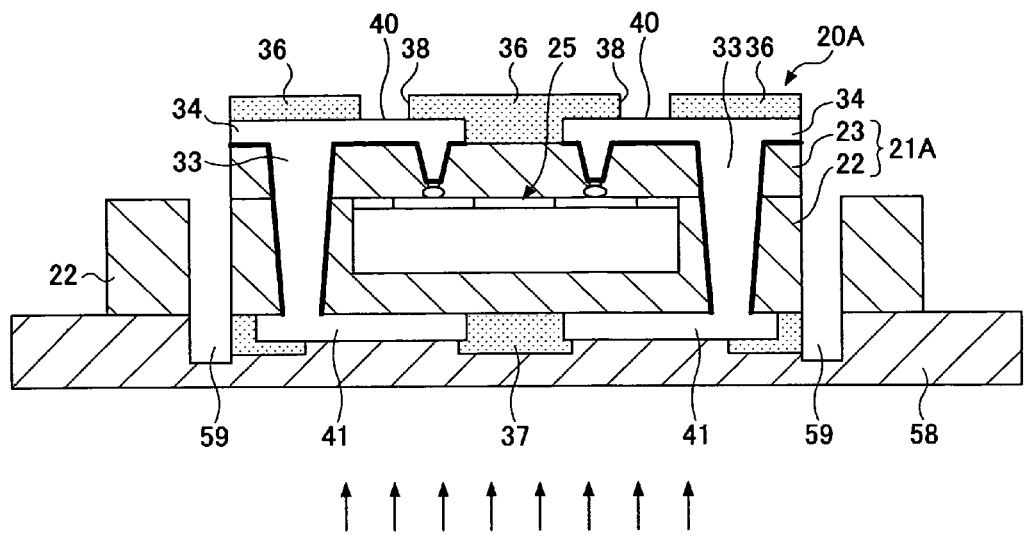

Referring to FIG. 16, a dicing tape 58 is applied to the substrate main body 21A provided with the outer chip mount pads 40 and the board mount terminals 41, so the substrate main body 21A is diced by a dicing blade (not shown). More specifically, the substrate main body 21A is diced on a line passing through the reference holes 51. Thus, a dicing groove 59 extending into the dicing tape 58 is formed, so that the substrate main body 21A is divided to be the electronic component embedded substrate 20A shown in FIG. 16.

A push pin pierces the dicing tape 58 from the lower side, so that the electronic component embedded substrate 20A is pushed upward and separated from the dicing tape 58. In this way, the electronic component embedded substrate 20A is produced.

With the above-described method for manufacturing the electronic component embedded substrate 20A according to this embodiment, the electronic component embedded substrate 20A wherein the center plane of the electronic component 25 in the thickness direction and the center plane of the substrate main body 21A in the thickness direction are positioned to match each other can be manufactured by just appropriately controlling the thickness of the first built-up layer 22 and the second built-up layer 23. Therefore, the electronic component embedded substrate 20A without warpage can be easily manufactured.

Figure 17:
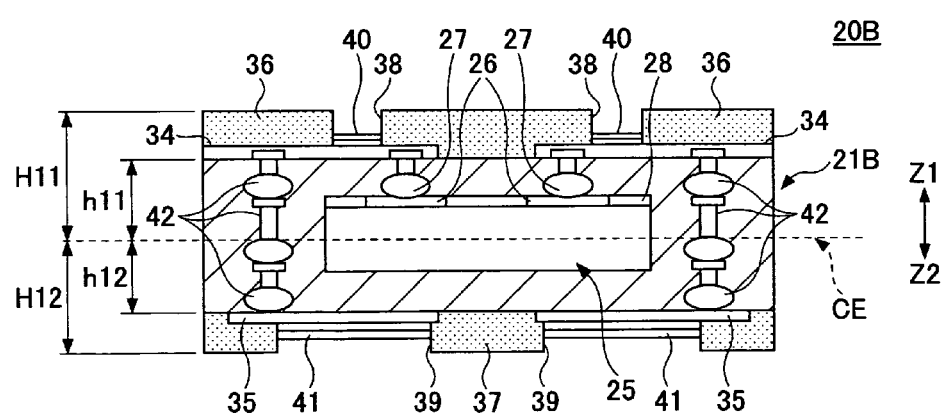
FIG. 17 is a cross-sectional view illustrating an electronic component embedded substrate according to a second embodiment of the present invention.

The following describes an electronic component embedded substrate 20B according to a second embodiment of the present invention. FIG. 17 is a cross-sectional view illustrating the electronic component embedded substrate 20B according to the second embodiment of the present invention. In FIG. 17, elements identical to those of the electronic component embedded substrate 20A of the first embodiment shown in FIG. 2 bear the same reference numbers and are not further described.

In the electronic component embedded substrate 20A according the first embodiment, the electrode vias 31 are used for providing the electric connection between the upper wires 34 and the electronic component 25, and the through vias 33 are used for providing the electric connection between the upper wires 34 and the lower wires 35.

On the other hand, in the electronic component embedded substrate 20B according to the second embodiment, only electrode stud bumps 27 are used for providing an electric connection between upper wires 34 and an electronic component 25, and stud bumps 42 are used for providing an electric connection between the upper wires 34 and lower wires 35.

Although there are differences as described above, the second embodiment is the same as the first embodiment in that a center plane of the electronic component 25 in a thickness direction (direction of arrows Z1 and Z2) and the center plane of the substrate main body 21B in the thickness direction (direction of arrows Z1 and Z2) are positioned to match each other, or are positioned on the same plane CE. Accordingly, a thickness h11 from the center plane CE to an upper face of the substrate main body 21B is equal to the thickness h12 from the center plane CE to a lower face of the substrate main body 21B (h11=h12).

Also, the center plane of the electronic component 25 in the thickness direction and the center plane of the electronic component embedded substrate 20B including solder resists 36 and 37 in the thickness direction (direction of arrows Z1 and Z2) are positioned to match each other. Accordingly, a thickness H11 from the center plane CE to the upper face of the electronic component embedded substrate 20B is equal to the thickness H12 from the center plane CE to the lower face of the electronic component embedded substrate 20B (H11=H12).

With this configuration, vertical thermal expansion of the electronic component embedded substrate 20B with respect to the center plane CE in the thickness direction is balanced, and therefore the electronic component embedded substrate 20B of the second embodiment is also prevented from being warped due to an imbalanced thermal expansion.

The following describes a method for manufacturing the above-described electronic component embedded substrate 20B with reference to FIGS. 18-41. In FIGS. 18-41, elements identical to those in FIGS. 2 through 16 illustrating the first embodiment and those in FIG. 17 bear the same reference numbers and are not further described.

Figure 18:
FIGS. 18-41 are schematic diagrams illustrating a method for manufacturing the electronic component embedded substrate according to the second embodiment of the present invention.

For manufacturing the electronic component embedded substrate 20B, a support body 60 with a copper foil 61 provided on one side as shown in FIG. 18 is prepared. The support body 60 may be made of, for example, PET, PI, or PEN. The thickness of the copper foil 61 is, for example, about 18 μm. The thickness of the support body 60 is, for example, about 200 μm.

Figure 19:
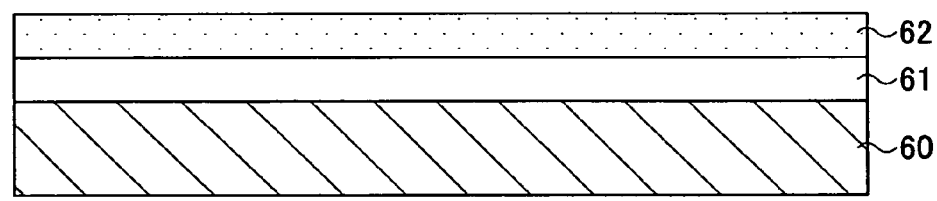
Figure 20:
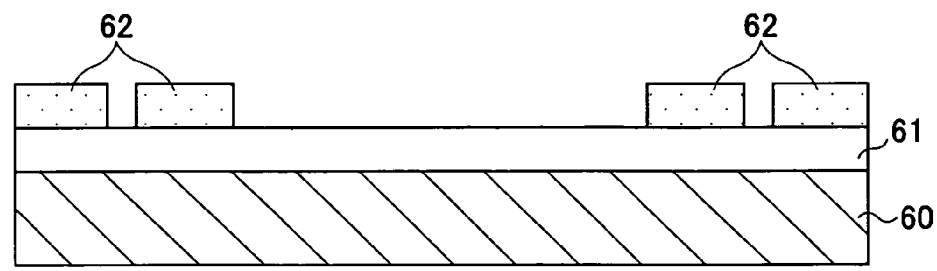

A DFR 62 is formed on an upper side of the copper foil 61 as shown in FIG. 19. The DFR 62 is laminated by a vacuum laminator. Then, referring to FIG. 20, the DFR 62 is patterned into a predetermined shape by exposure and development. More specifically, the DFR 62 is removed except for a predetermined outer part thereof and a part under which lower wires 35 are to be formed.

Figure 21:
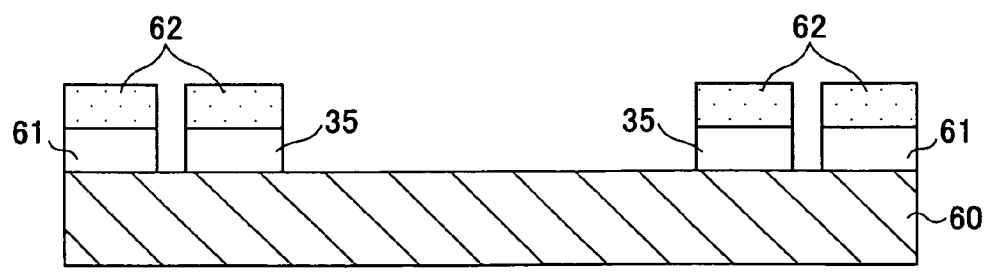
Figure 22:
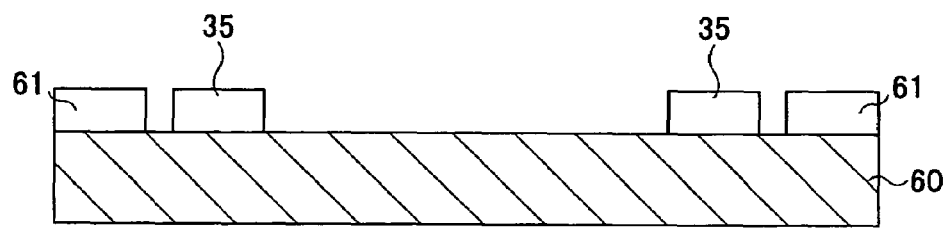

Using the remaining DFR 62 as a mask, the copper foil 61 is etched. As a result, the wires 35 are formed, and the copper foil 61 remains on the predetermined outer part as shown in FIG. 21. Referring to FIG. 22, after the etching is completed, the DFR 62 is removed.

Figure 23:
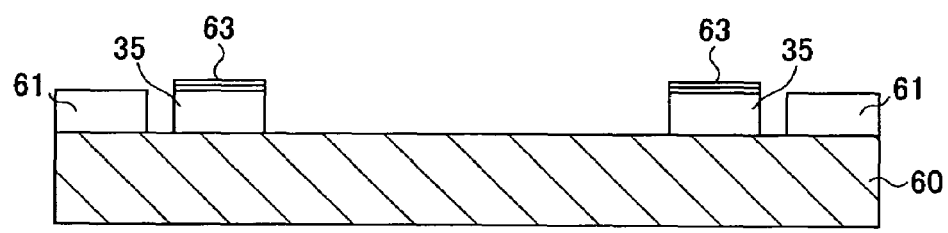
Figure 24:
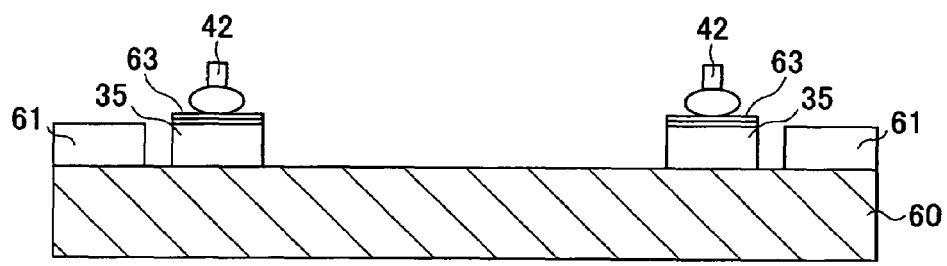

Referring to FIG. 23, Ni/Au plating portions 63 are formed on upper faces of the lower wires 35. The Ni/Au plating portions 63 serve as barrier metal portions. Referring to FIG. 24, stud bumps 42 are formed on upper sides of the lower wires 35 with the Ni/Au plating portions formed thereon. The stud bumps 42 are gold bumps, which are formed with wire bonding techniques. Therefore, the stud bumps 42 can be easily formed.

Figure 25:
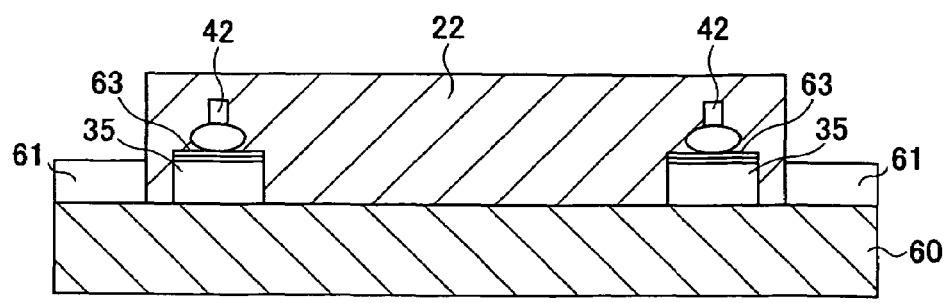

Then, a first built-up layer 22 is formed on an upper side of the support body 60 so as to cover the lower wires 35 and stud bumps 42. The first built-up layer 22, which is not cured yet, is laminated by a vacuum laminator. FIG. 25 illustrates the first built-up layer 22 formed on the support body 60.

Then, tip ends of the stud bumps 42 are exposed from the first built-up layer 22. More specifically, by resin-etching a surface of the first built-up layer 22, the tip ends of the stud bumps 42 are exposed from the first built-up layer 22.

Figure 26:
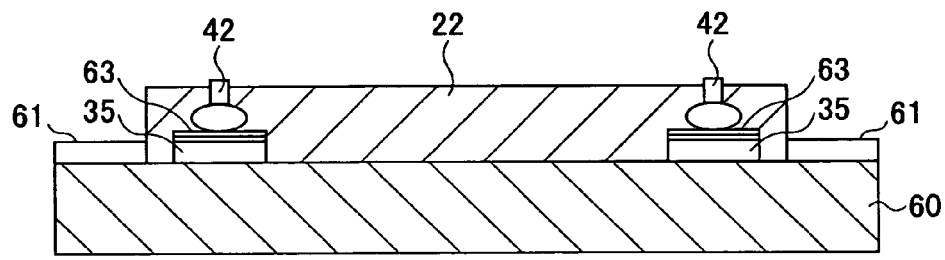

Examples of the resin etching include desmearing, dry etching, and μ blasting. FIG. 26 illustrates the stud bumps 42 with the tip ends thereof exposed from the first built-up layer 22.

Figure 27:
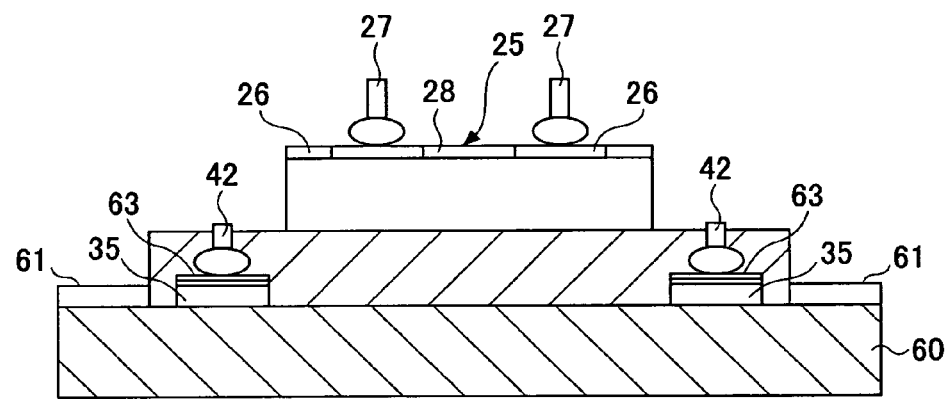

Referring to FIG. 27, an electronic component 25 is mounted on an upper face of the first built-up layer 22. In this step, the electronic component 25 is positioned on the first built-up layer 22 with reference to the stud bumps 42. Electrode stud bumps 27 are formed on the electronic component 25 in advance.

Figure 28:
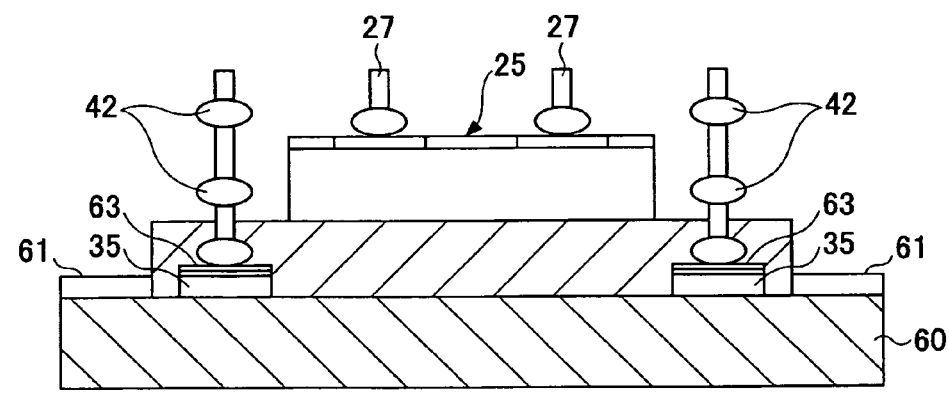

After the electronic component 25 is mounted on the first built-up layer 22, additional stud bumps 42 are built upon the existing stud bumps 42 as shown in FIG. 28. Building up multiple stud bumps 42 can be easily done using well-known techniques therefor.

The number of the stud bumps 42 to be built up is determined such that upper ends of the stud bumps 42 at the top are substantially aligned with upper ends of the electrode stud bumps 27 provided on the electronic component 25.

Figure 29:
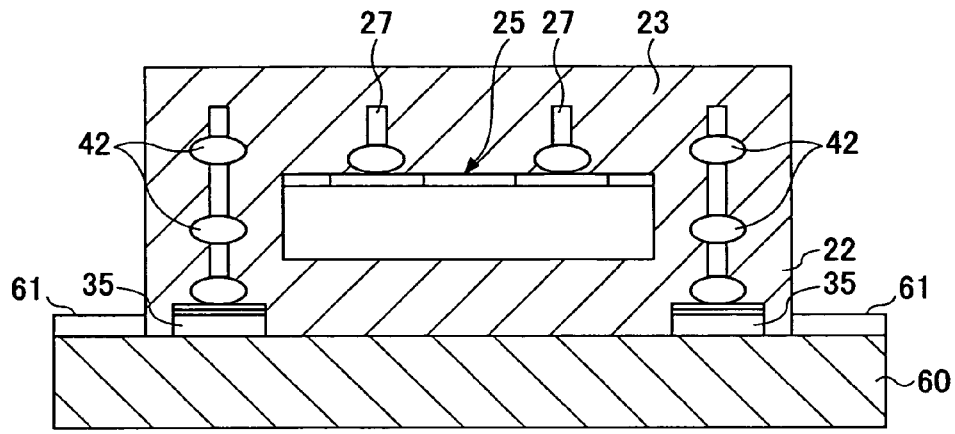

With reference to FIG. 29, after the stud bumps 42 are built up, a second built-up layer 23 is formed on an upper side of the first built-up layer 22. The second built-up layer 23, which is not cured yet, is laminated by a vacuum laminator and flattened by hot pressing.

Then, tip ends of the top stud bumps 42 are exposed from the second built-up layer 23. More specifically, by resin-etching a surface of the second built-up layer 23, the tip ends of the top stud bumps 42 are exposed from the second built-up layer 23.

Figure 30:
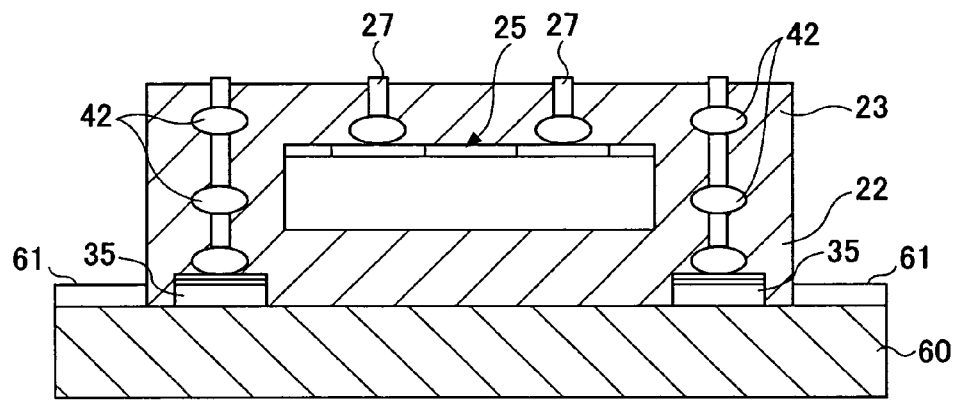

Examples of the resin etching include desmearing, dry etching, and μ blasting. FIG. 30 illustrates the top stud bumps 42 with the tip ends thereof exposed from an upper face of the second built-up layer 23.

Figure 31:
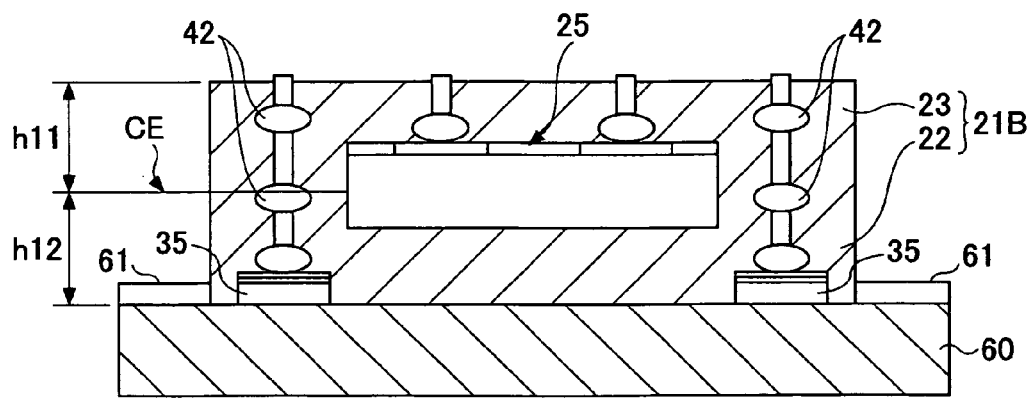

After the tip ends of the top stud bumps 42 are exposed as described above, the first and second built-up layers 22 and 23 are completely cured by heating at the same time. In this way, the substrate main body 21B shown in FIG. 31 is formed.

The center plane CE of the electronic component 25 in the thickness direction and the center plane of the substrate main body 21B in the thickness direction are positioned to match each other. The thickness h11 from the center plane CE to the upper face of the second built-up layer 23 is equal to the thickness h12 from the center plane CE to the lower face of the first built-up layer 22 (h11=h12). This configuration is easily achieved by appropriately selecting the thicknesses of the built-up layers 22 and 23, the heights of the stud bumps 27 and 42, and the number of the stud bumps 42 to be built up.

Figure 32:
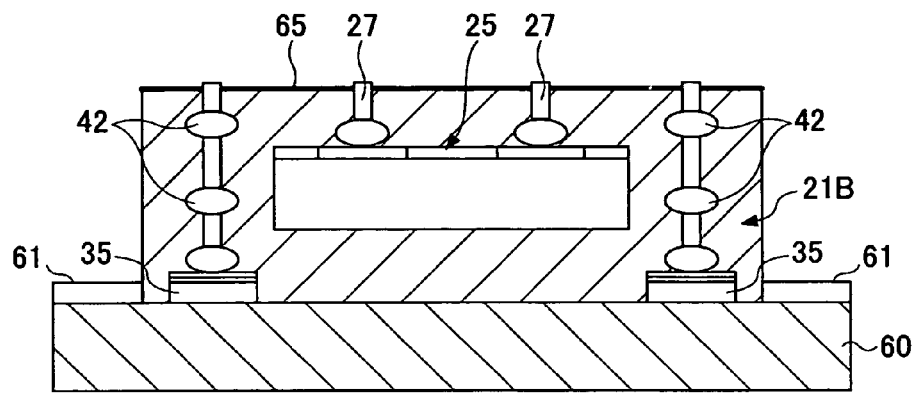
Figure 33:
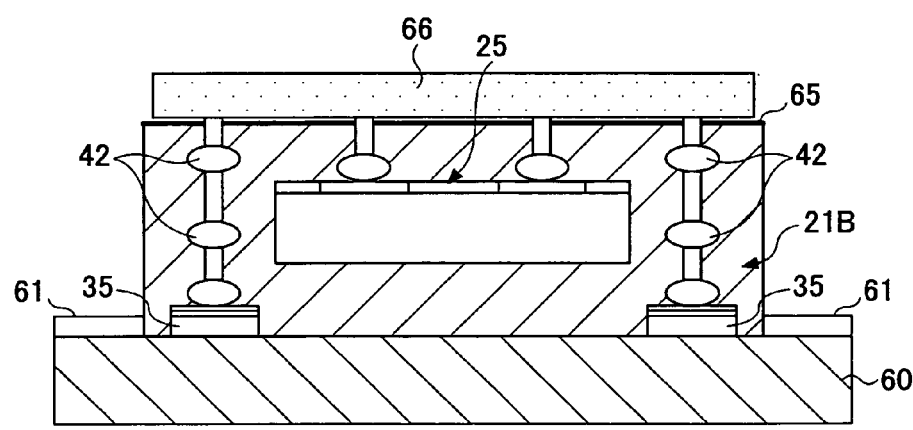

With reference to FIG. 32, the electroless copper plating is applied on an upper face of the substrate main body 21B (the second built-up layer 23) from which the tip ends of the electrode stud bumps 27 and the stud bumps 42 are exposed, so that a copper film 65 is formed on the upper face of the substrate main body 21B. Then, a DFR 66 is formed on the upper face of the substrate main body 21B with the copper film 65 formed thereon. The DFR 66 is laminated by a vacuum laminator. FIG. 33 illustrates the DFR 66 formed on the substrate main body 21B.

Figure 34:
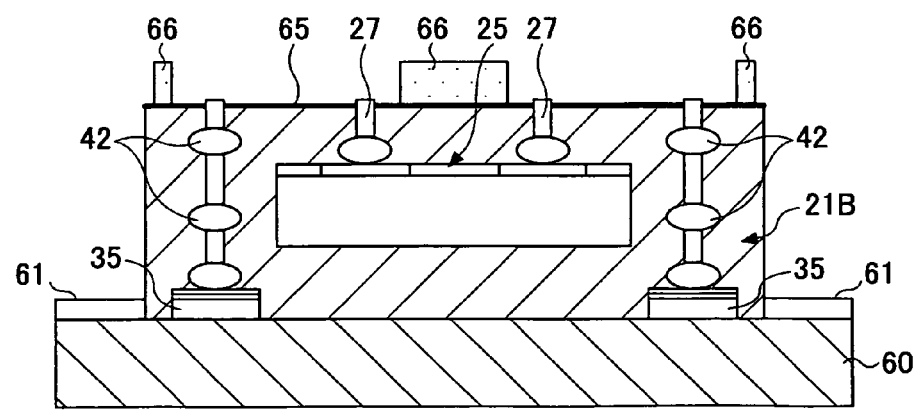

Then, referring to FIG. 34, the DFR 66 is patterned into a predetermined shape by exposure and development. More specifically, portions of the DFR 66 where the upper wires 34 are to be formed are removed. The exposure of the DFR 66 is performed with reference to the stud bumps 27 and 42 exposed on the upper face of the substrate main body 21B. Therefore, the DFR 66 can be patterned with high accuracy.

Figure 35:
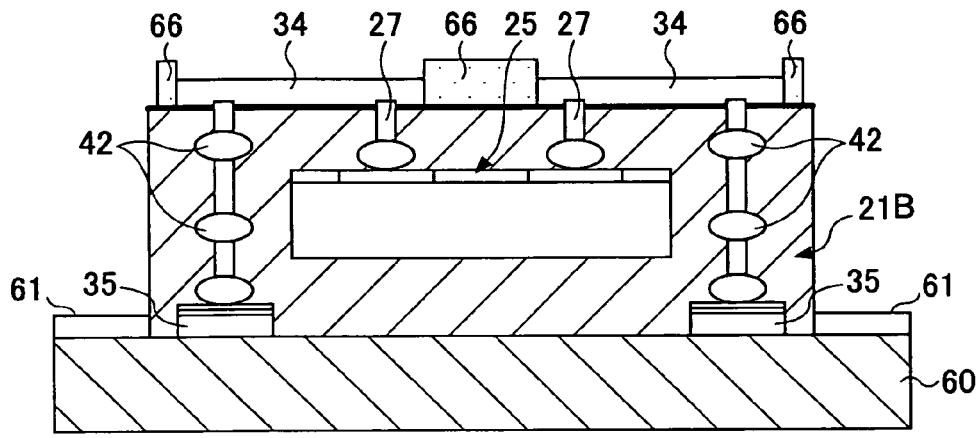

Subsequently, electrolytic copper plating is performed using the copper film 65 as a seed layer. In this way, the upper wires 34 are formed on the upper face of the substrate main body 21B as shown in FIG. 35. The upper wires 34 are electrically connected to both the electrode stud bumps 27 and the stud bumps 42.

As a result, the upper wires 34 are electrically connected to the electronic component 25 through the electrode stud bumps 27. The upper wires 34 are also connected to the lower wires 35 through the built-up stud bumps 42. In this embodiment, because the electric connections in the electronic component embedded substrate 20B are made through the stud bumps 27 and 42 that can be easily formed, the cost of the electronic component embedded substrate 20B can be reduced.

Figure 36:
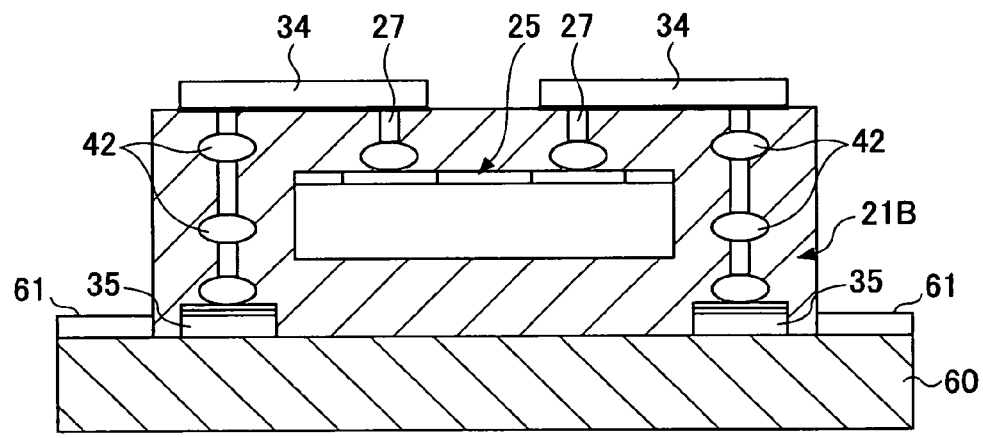

After the electrolytic copper plating is completed, the DFR 66 is removed. Then, the exposed copper film 65 provided as a seed layer is removed. FIG. 36 illustrates the substrate main body 21B with the DFR 66 and the copper film 65 removed.

Figure 37:
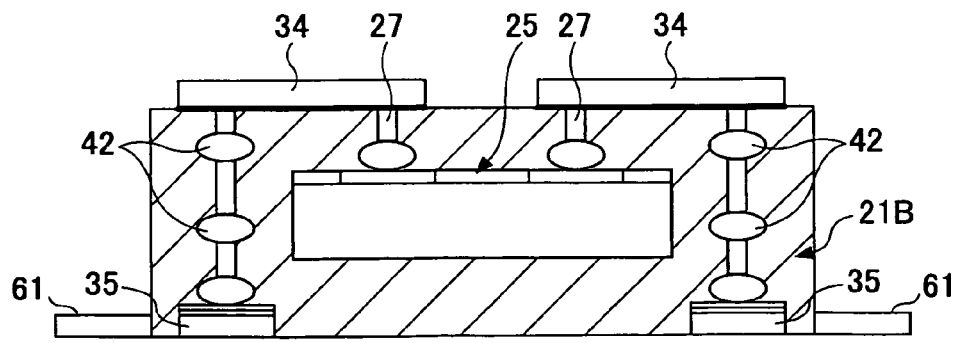
Figure 38:
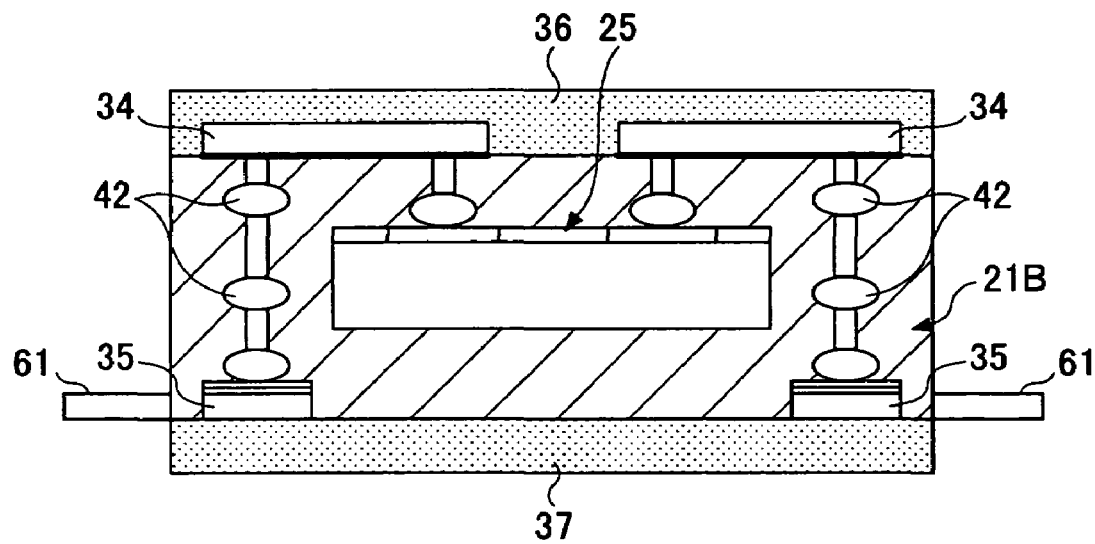

Then, the support body 60 is removed (FIG. 37). An upper solder resist 36 is formed on the upper face of the substrate main body 21B, and a lower solder resist 37 is formed on a lower face of the substrate main body 21B that is exposed by removing the support body 60. The solder resists 36 and 37 are laminated by a vacuum laminator. FIG. 38 illustrates the solder resists 36 and 37 formed on the substrate main body 21B.

Figure 39:
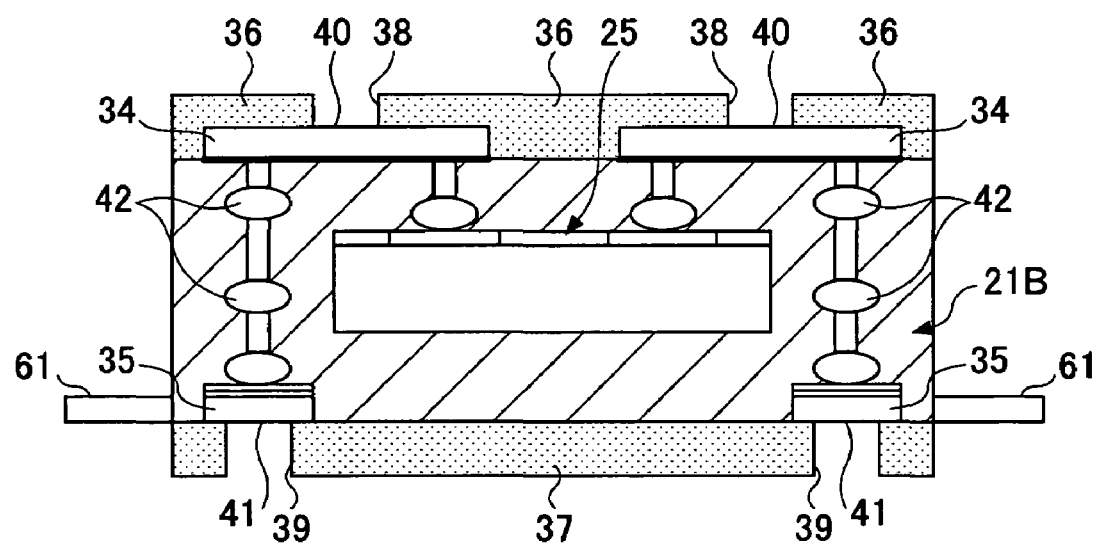
Figure 40:
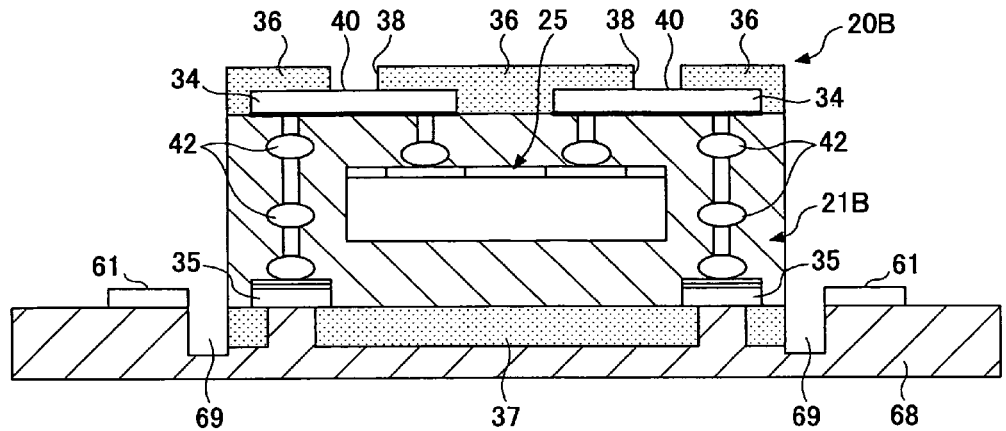

After that, with reference to FIG. 39, the solder resists 36 and 37 are patterned into predetermined shapes by exposure and development. More specifically, openings 38 are formed in the upper solder resist 36, so that outer chip pads 40 are formed. On the other hand, openings 39 are formed in the lower solder resist 37, so that board mount terminals 41 are formed.

A dicing tape 68 is applied to the substrate main body 21B provided with the outer chip mount pads 40 and the board mount terminals 41, so the substrate main body 21B is diced by a dicing blade (not shown). More specifically, the substrate main body 21B is diced through a line passing through the remaining copper foil 61. Thus, a dicing groove 69 extending into the dicing tape 68 is formed, so that the substrate main body 21B is divided to be the electronic component embedded substrate 20B shown in FIG. 40.

Figure 41:
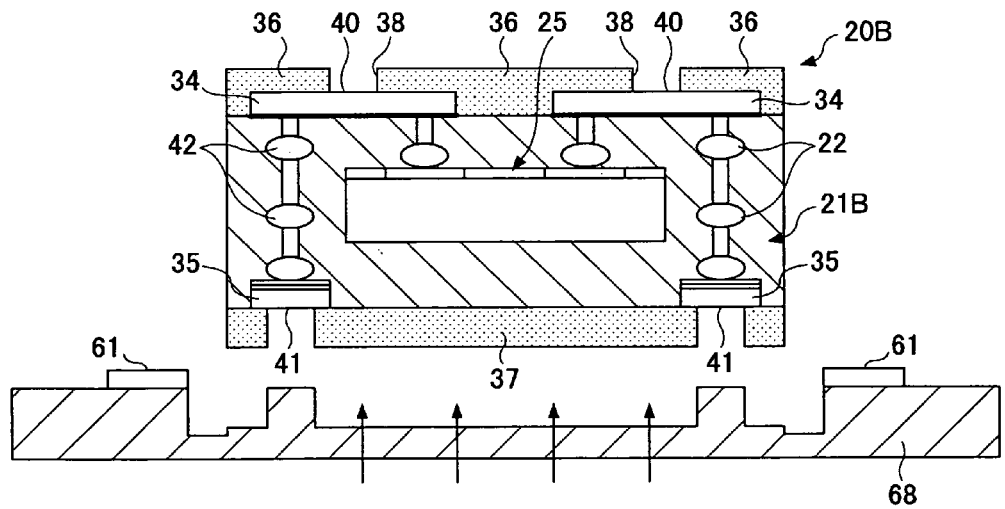

Referring to FIG. 41, a push pin pierces the dicing tape 68 from the lower side, so that the electronic component embedded substrate 20B is pushed upward and separated from the dicing tape 68. In this way, the electronic component embedded substrate 20B is produced.

With the above-described method for manufacturing the electronic component embedded substrate 20B according to this embodiment, the electronic component embedded substrate 20B wherein the center plane of the electronic component 25 in the thickness direction and the center plane of the substrate main body 21B in the thickness direction are positioned to match each other can be manufactured by just appropriately selecting the thickness of the built-up layers 22 and 23, the height of the stud bumps 27 and 42, and the number of the stud bumps 42 to be built up. Therefore, the electronic component embedded substrate 20B without warpage can be easily manufactured.

Figure 42:
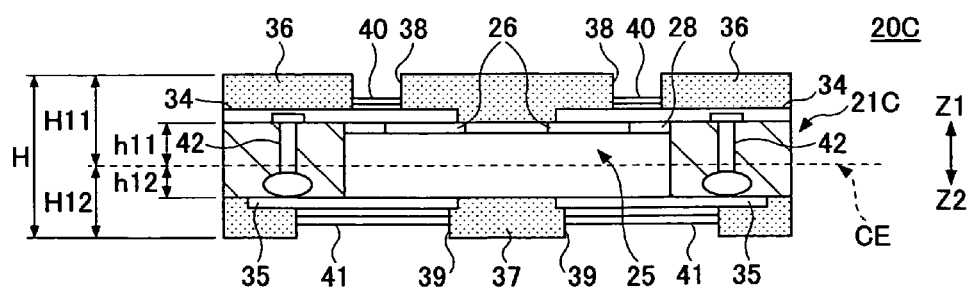
FIG. 42 is a cross-sectional view illustrating an electronic component embedded substrate according to a third embodiment of the present invention.

The following describes an electronic component embedded substrate 20C according to a third embodiment of the present invention. FIG. 42 illustrates the electronic component embedded substrate 20C according to the third embodiment of the present invention. In FIG. 42, elements identical to those of the electronic component embedded substrates 20A and 20B of the first and second embodiments shown in FIGS. 2 and 17 bear the same reference numbers and are not further described.

In the electronic component embedded substrate 20A, 20B of the first and second embodiments, the electronic components 25 is completely enclosed within the substrate main body 21A, 21B. In other words, the substrate main body 21A, 21B is present on both the upper face and the lower face of the electronic component 25.

On the other hand, in the electronic component embedded substrate 20C of the third embodiment, a substrate main body 21C is configured to surround only lateral faces of an electronic component 25. In other words, the substrate main body 21C has a shape of a frame with a clearance area in the center in which the electronic component 25 is located.

The electronic component embedded substrate 20C is configured such that the electronic component 25 is embedded in the substrate main body 21C, but the upper and lower faces of the electronic component 25 are not covered with the substrate main body 21C. A part of upper wires 34 and a part of the lower wires 35 are formed directly on the electronic component 25.

Although there are differences as described above, the third embodiment is the same as the first and second embodiments in that a center plane of the electronic component 25 in a thickness direction (direction of arrows Z1 and Z2) and the center plane of the substrate main body 21C in the thickness direction (direction of arrows Z1 and Z2) are positioned to match each other, or are positioned on the same plane CE. Accordingly, a thickness h11 from the center plane CE to the upper face of the substrate main body 21C is equal to the thickness h12 from the center plane CE to the lower face of the substrate main body 21C (h11=h12).

Also, the center plane of the electronic component 25 in the thickness direction and the center plane of the electronic component embedded substrate 20C including solder resists 36 and 37 in the thickness direction (direction of arrows Z1 and Z2) are positioned to match each other. Accordingly, a thickness H11 from the center plane CE to the upper face of the electronic component embedded substrate 20C is equal to the thickness H12 from the center plane CE to the lower face of the electronic component embedded substrate 20C (H11=H12).

With this configuration, thermal expansion of the electronic component embedded substrate 20C in the thickness direction with respect to the center plane CE is balanced, and therefore the electronic component embedded substrate 20C of the third embodiment is also prevented from being warped due to the thermal expansion.

According to the third embodiment, because the electronic component embedded substrate 20C is configured such that the substrate main body 21C is not present on the upper face nor the lower face of the electronic component 25 as mentioned above, the thickness (indicated by an arrow H) of the electronic component embedded substrate 20C can be significantly reduced compared to the electronic component embedded substrates 20A and 20B.

According to the methods for manufacturing the electronic component embedded substrates 20A and 20B of the first and second embodiments, the electronic component 25 is incorporated, i.e., embedded in, the substrate main body 21A, 21B. The following describes methods for incorporating (embedding) the substrate main body 21A, 21B into the first and second built-up layers 22 and 23 with reference to FIGS. 43A through 45E.

Figure 43A:
FIGS. 43A-43E are schematic diagrams illustrating a method for embedding an electronic component into a substrate main body.
Figure 43B:
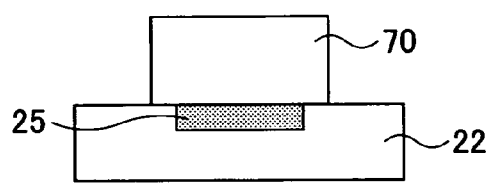

According to a method shown in FIGS. 43A through 43E, an electronic component 25 is placed at a predetermined embedding position on an uncured first built-up layer 22 (FIG. 43A). Then, referring to FIG. 43B, the electronic component 25 is heated from the upper side by a bonding head 70 so that the electronic component 25 is pressed into the first built-up layer 22.

Figure 43C:
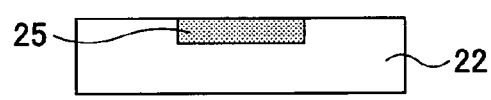
Figure 43D:
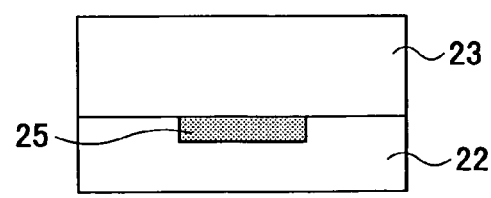
Figure 43E:
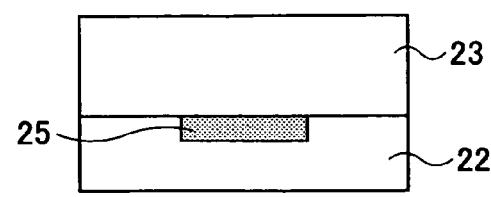

The first built-up layer 22 is cured, but not completely, by the heat of the bonding head 70. The electronic component 25 is thus embedded in the first built-up layer 22. In this state, an upper face of the electronic component 25 is exposed on an upper face of the first built-up layer 22 as shown in FIG. 43C.

Then, a second built-up layer 23 is laminated on the upper side of the first built-up layer 22 in which the electronic component 25 is embedded. The second built-up layer 23, which is not cured yet, is laminated by a vacuum laminator. Then, the first and second built-up layers 22 and 23 are heated at the same time so as to be completely cured. In this way, a substrate main body within which the electronic component 25 is embedded is formed.

According to a method shown in FIGS. 44A through 44E, a third built-up layer 24, in which an opening 24a is formed in advance, is laminated on the uncured built-up layer 22 (FIG. 44A) by a vacuum laminator. The thickness of the third built-up layer 24, which is not cured yet, and the shape of the opening 24a are corresponding to the thickness and the shape of an electronic component 25.

Figure 44A:
FIGS. 44A-44E are schematic diagrams illustrating another method for embedding an electronic component into a substrate main body.
Figure 44B:
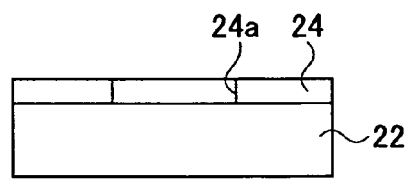
Figure 44C:
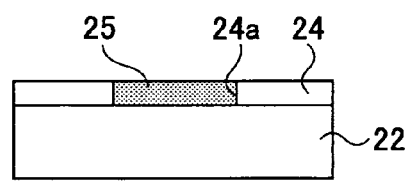
Figure 44D:
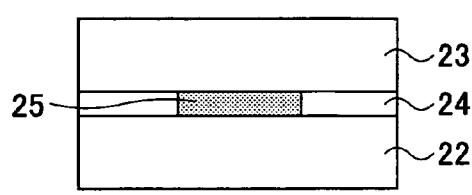
Figure 44E:
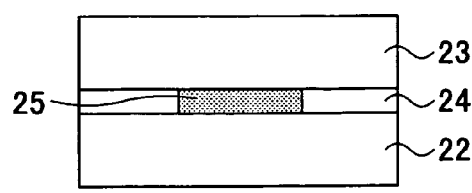

Then, as shown in FIG. 44C, the electronic component 25 is located in the opening 24a. In this state, the electronic component 25 is embedded on the first built-up layer 22 and in the third built-up layer 24. The upper face of the electronic component 25 is substantially flush with an upper face of the third built-up layer 24.

A second built-up layer 23 is laminated on the upper side of the third built-up layer 24 in which the electronic component 25 is embedded. The second built-up layer 23, which is not cured yet, is laminated by a vacuum laminator. The first through third built-up layers 22 through 24 are heated at the same time so as to be completely cured. In this way, a substrate main body within which the electronic component 25 is embedded is formed.

Figure 45A:
FIGS. 45A-45E are schematic diagrams illustrating another method for embedding an electronic component into a substrate main body.
Figure 45B:
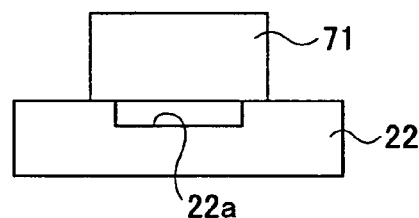
Figure 45C:
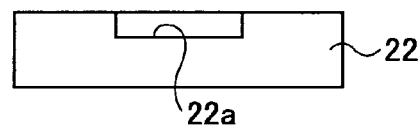

According to a method shown in FIGS. 45A through 45E, an uncured first built-up layer 22 (FIG. 45A) is press-molded by a mold 71 (FIG. 45B). A mount recess 22a as shown in FIG. 45C is thus formed in the first built-up layer 22. The shape of the mount recess 22a corresponds to the shape of an electronic component 25.

Figure 45D:
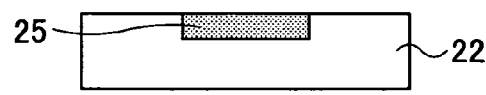
Figure 45E:
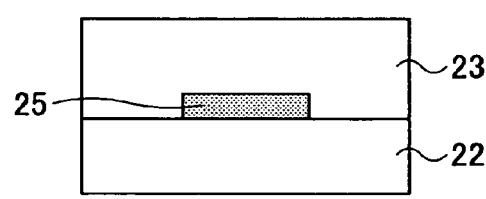

Then, as shown in FIG. 45D, the electronic component 25 is mounted in the mount recess 22a. In this state, an upper face of the electronic component 25 is exposed on an upper face of the first built-up layer 22.

The second built-up layer 23 is laminated on the upper side of the first built-up layer 22 in which the electronic component 25 is embedded. The second built-up layer 23, which is not cured yet, is laminated by a vacuum laminator. Then, the first and second built-up layers 22 and 23 are heated at the same time so as to be completely cured. In this way, a substrate main body within which the electronic component 25 is embedded is formed. With use of any one of the above methods, the electronic component 25 can be easily incorporated (embedded) into the substrate main body.

The present application is based on Japanese Priority Application No. 2004-225543 filed on Aug. 2, 2004, with the Japanese Patent Office, the entire contents of which are hereby incorporated by reference.

What is claimed is:

1. An electronic component embedded substrate, comprising:
    a substrate main body including a first built-up layer and a second built-up layer and being made of made of insulating epoxy resin; and
    an electronic component embedded in the substrate main body; wherein the substrate main body is in contact with lateral sides of the electronic component; and
    wherein a center plane of the electronic component in a thickness direction thereof and a center plane of the substrate main body in a thickness direction thereof generally match each other; and
    wherein the thickness from the matching center planes to the upper face of the second built-up layer is equal to the thickness from the matching center planes to the lower face of the built up layer.

2. The electronic component embedded substrate as claims in claim 1,
    wherein wires formed on the substrate main body are interconnected through a first via; and one of the wires and the electronic component are interconnected through a second via.

3. The electronic component embedded substrate as claimed in claim 1,
    wherein wires formed on the substrate main body are interconnected through a first stud bump; and one of the wires and the electronic component are interconnected through a second stud bump.

4. An electronic component embedded substrate comprising:
    a substrate main body made of insulating epoxy resin; and
    an electronic component embedded in the substrate main body, wherein the substrate main body is in contact with lateral sides of the electronic component;
    wherein a center plane of the electronic component in a thickness direction thereof and a center plane of the substrate main body in a thickness direction thereof, generally match each other; and
    wherein the substrate main body is configured to surround the electronic component only on lateral faces of the electronic component.

5. The electronic component embedded substrate as claimed in claim 1, wherein the electronic component is embedded in the first built-up layer of the substrate main body.

6. The electronic component embedded substrate as claimed in claim 1, wherein the electronic component is mounted on the upper surface of the first built-up layer of the substrate main body.

7. A method for manufacturing an electronic component embedded substrate, comprising the steps of:
    arranging an electronic component on a first insulating layer;
    laminating a second insulating layer on the first insulating layer with the electronic component arranged thereon, thereby forming a substrate main body in which the electronic component is embedded such that a center plane of the laminated first and second insulating layers in a thickness direction thereof and a center plane of the electronic component in the thickness direction thereof match each other;
    forming a through via hole extending through the substrate main body and an electrode via hole communicating with an electrode of the electronic component in the substrate main body; and
    forming a via in each of the through via hole and the electrode via hole while forming a wire on the substrate main body.

8. A method for manufacturing an electronic component embedded substrate, comprising the steps of;
    forming a first wire on a support plate;
    forming a first stud bump on the first wire;
    forming a first insulating layer on the support plate such that only a tip end of the first stud bump is exposed;
    arranging an electronic component on the first insulating layer;
    building up a second stud bump on the first stud bump so as to be substantially level with an electrode of the electronic component;
    laminating a second insulating layer having substantially the same thickness as the first insulating layer on the first insulating layer such that the electronic component and the second stud bump are covered by the second insulating layer but only the electrode of the electronic component and a tip end of the second stud bump are exposed, thereby forming a substrate main body in which the electronic component is embedded such that a center plane of the laminated first and second insulating layers in a thickness direction thereof and a center plane of the electronic component in the thickness direction thereof match each other; and
    forming a second wire that connects the electrode of the electronic component to the second stud bump.

* * * * *

UNITED STATES PATENT AND TRADEMARK OFFICE
CERTIFICATE OF CORRECTION

PATENT NO. : 7,420,128 B2
APPLICATION NO. : 11/190651
DATED : September 2, 2008
INVENTOR(S) : Masahiro Sunohara et al.

It is certified that error appears in the above-identified patent and that said Letters Patent is hereby corrected as shown below:

In the Claims

Claim 1, at column 13, line 43; the term "being made of made of" should read "being made of".

Claim 1, at column 13, line 55; the term "the built up layer" should read "the first built-up layer".

Signed and Sealed this
Seventeenth Day of June, 2014

Michelle K. Lee
*Deputy Director of the United States Patent and Trademark Office*